United States Patent
Udrea et al.

(10) Patent No.: US 9,831,330 B2
(45) Date of Patent: Nov. 28, 2017

(54) BIPOLAR SEMICONDUCTOR DEVICE HAVING A DEEP CHARGE-BALANCED STRUCTURE

(71) Applicant: Infineon Technologies Americas Corp., El Segundo, CA (US)

(72) Inventors: Florin Udrea, Cambridge (GB); Alice Pei-Shan Hsieh, Cambridge (GB); Gianluca Camuso, Cambridge (GB); Chiu Ng, El Segundo, CA (US); Yi Tang, Torrance, CA (US); Rajeev Krishna Vytla, Los Angeles, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 14/986,054

(22) Filed: Dec. 31, 2015

(65) Prior Publication Data
US 2016/0260823 A1 Sep. 8, 2016

Related U.S. Application Data

(60) Provisional application No. 62/128,922, filed on Mar. 5, 2015.

(51) Int. Cl.
*H03K 3/00* (2006.01)
*H01L 29/739* (2006.01)
*H01L 29/06* (2006.01)

(52) U.S. Cl.
CPC ...... *H01L 29/7397* (2013.01); *H01L 29/0634* (2013.01)

(58) Field of Classification Search
CPC .............. H01L 27/082; H01L 27/1022; H01L 29/0817; H01L 29/66234; H01L 27/0623;
(Continued)

(56) References Cited

U.S. PATENT DOCUMENTS 8,248,116 B2 * 8/2012 Soeno .............. H01L 29/0834
257/577
8,304,814 B2 11/2012 Bauer
(Continued)

OTHER PUBLICATIONS

M. Antoniou, F. Udrea and F. Bauer, "Optimization of Super Junction Bipolar Transistor for Ultra-fast Switching Applications", Proc. ISPSD'2007, p. 101-104.
(Continued)

*Primary Examiner* — Mary Wilczewski
*Assistant Examiner* — Tsz Chiu
(74) *Attorney, Agent, or Firm* — Murphy, Bilak & Homiller, PLLC

(57) ABSTRACT

There are disclosed herein various implementations of a bipolar semiconductor device having a deep charge-balanced structure. Such a device includes a drift region having a first conductivity type situated over an anode layer having a second conductivity type. The device also includes a control trench extending through an inversion region having the second conductivity type into the drift region, and bordered by a cathode diffusion having the first conductivity type. In addition, the device includes a deep sub-trench structure situated under the control trench. The deep sub-trench structure includes one or more first conductivity regions having the first conductivity type and one or more second conductivity region having the second conductivity type, the one or more first conductivity regions and the one or more second conductivity regions configured to substantially charge-balance the deep sub-trench structure. In one implementation, the bipolar semiconductor device is an insulated-gate bipolar transistor (IGBT).

10 Claims, 6 Drawing Sheets

(58) Field of Classification Search
CPC .................. H01L 29/73; H01L 29/735; H01L 2924/13015
See application file for complete search history.

(56) References Cited

U.S. PATENT DOCUMENTS

| | | | |
|---|---|---|---|
| 9,024,383 | B2 | 5/2015 | Gamerith et al. |
| 9,093,522 | B1 | 7/2015 | Zeng et al. |
| 2007/0034941 | A1* | 2/2007 | Francis ............... H01L 29/7397 257/328 |
| 2008/0135929 | A1* | 6/2008 | Saito ................... H01L 29/0634 257/330 |
| 2010/0264488 | A1 | 10/2010 | Hsieh |
| 2011/0084333 | A1 | 4/2011 | Disney |
| 2014/0077289 | A1 | 3/2014 | Miyajima |
| 2014/0097517 | A1 | 4/2014 | Moens |
| 2015/0115286 | A1* | 4/2015 | Takeuchi ............ H01L 21/8213 257/77 |

OTHER PUBLICATIONS

M. Antoniou, F. Udrea, and F. D. Bauer, "The superjunction insulated gate bipolar transistor-Optimization and modeling," IEEE Trans. Electron Devices, vol. 57, No. 3, p. 594-600, Mar. 2010.

M. Antoniou, F. Udrea, F. D. Bauer, A. Mihaila, and I. Nistor "Towards Achieving the Soft-Punch-Through Superjunction Insulated-Gate Bipolar Transistor Breakdown Capability", IEEE Electron Device Letters, vol. 32, No. 9, Sep. 2011, p. 1275-1277.

F. Bauer, I. Nistor, A. Mihaila, M. Antoniou, and F. Udrea "Superjunction IGBT Filling the Gap Between SJ MOSFET and Ultrafast IGBT", IEEE Electron Device Letters, vol. 33, No. 9, Sep. 2012, p. 1288-1290.

* cited by examiner

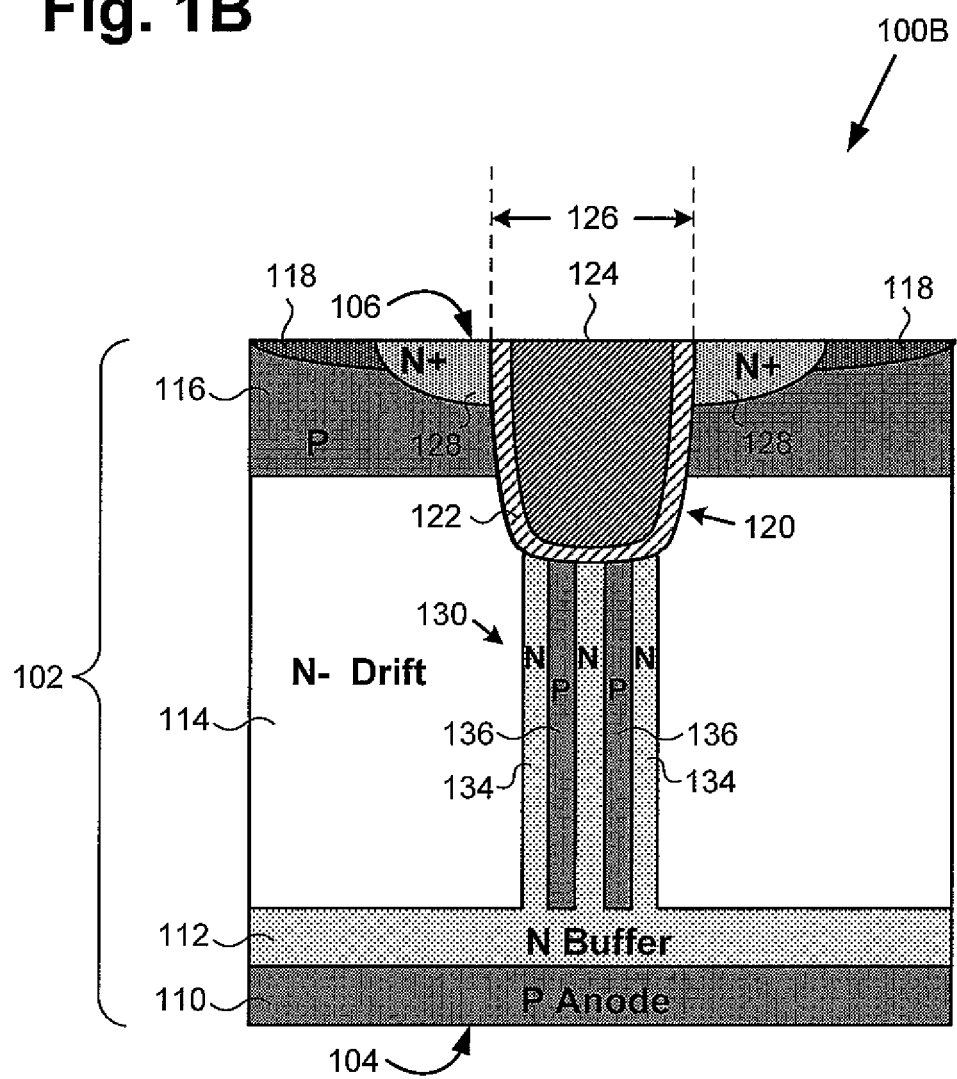

BIPOLAR SEMICONDUCTOR DEVICE HAVING A DEEP CHARGE-BALANCED STRUCTURE

The present application claims the benefit of and priority to a provisional application titled "Super Junction IGBT with PNN Structure for High Frequency Applications," Ser. No. 62/128,922 filed on Mar. 5, 2015. The disclosure in this provisional application is hereby incorporated fully by reference into the present application.

BACKGROUND

Background Art

Bipolar semiconductor devices suitable for use as power switches, such as insulated-gate bipolar transistors (IGBTs), for example, may be implemented in a variety of applications. For instance, IGBTs may be used as power switches in motor drive inverters, as well as in direct-current (DC) to DC power converters. In these and other power applications, turn-off losses ($E_{OFF}$) and on-state voltage drop ($V_{ON}$) are typically key operating parameters, so that IGBTs having low $V_{ON}$ and substantially minimized $E_{OFF}$ during fast switching are highly desirable.

However, as switching speed increases, switching losses, including $E_{OFF}$, typically represent a significant portion of total power loss by a bipolar power switch. Moreover, conventional techniques for minimizing $E_{OFF}$ during fast switching can have undesirable consequences for the on-state characteristics of the bipolar power switch, such as $V_{ON}$.

SUMMARY

The present disclosure is directed to a bipolar semiconductor device having a deep charge-balanced structure, substantially as shown in and/or described in connection with at least one of the figures, and as set forth in the claims.

BRIEF DESCRIPTION OF THE DRAWINGS

FIG. 1B presents a cross-sectional view showing a portion of an exemplary bipolar semiconductor device having a deep charge-balanced structure, according to another implementation.

DETAILED DESCRIPTION

Figure 1A:
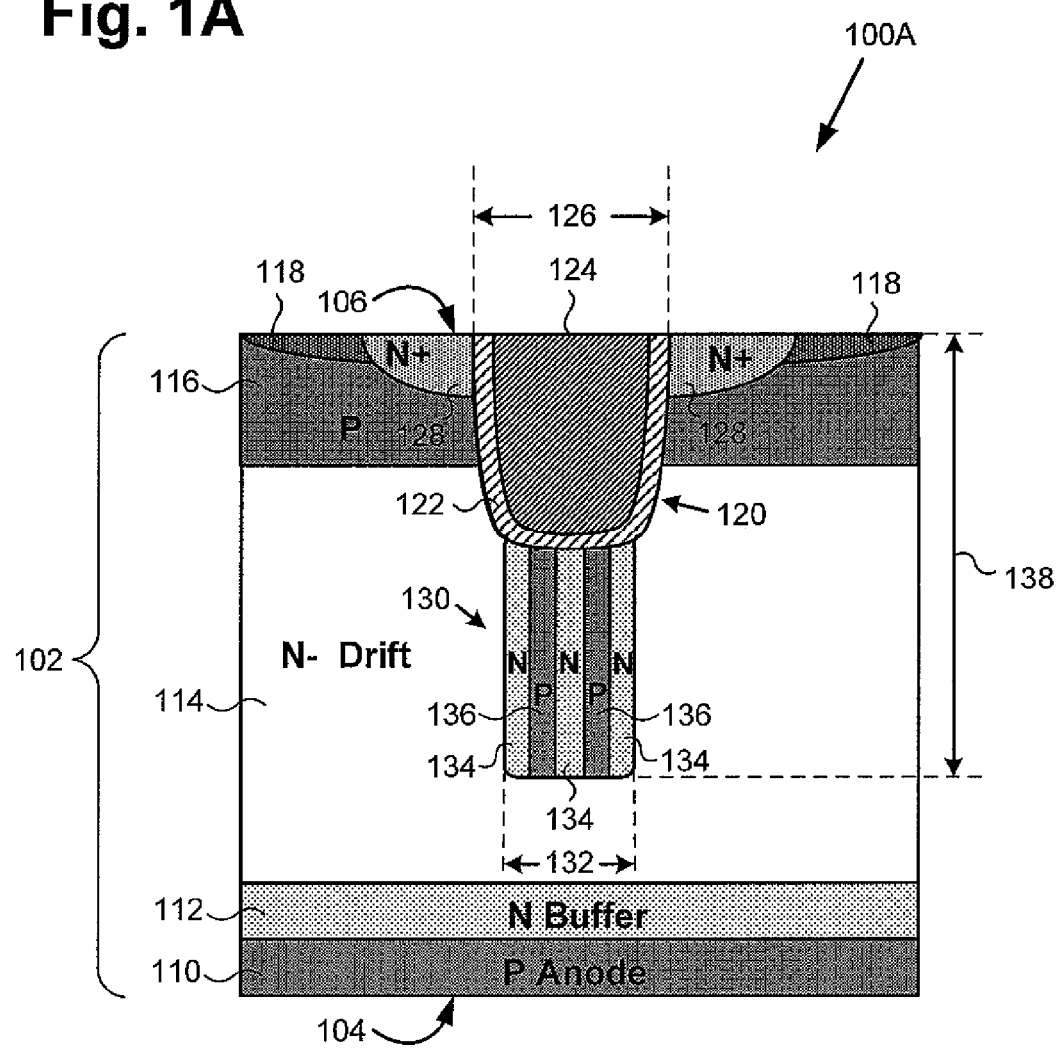
FIG. 1A presents a cross-sectional view showing a portion of an exemplary bipolar semiconductor device having a deep charge-balanced structure, according to one implementation.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1A presents a cross-sectional view showing a portion of exemplary bipolar semiconductor device 100A having a deep charge-balanced structure, according to one implementation. As shown in FIG. 1A, bipolar semiconductor device 100A is implemented as a vertical power device including P type anode layer 110 at bottom surface 104 of semiconductor substrate 102, and N type drift region 114 situated over P type anode layer 110. In addition, P type inversion region 116 is situated over N type drift region 114. As further shown in FIG. 1A, bipolar semiconductor device 100A includes N type buffer or field stop layer 112 (hereinafter "buffer layer 112"), as well as N type cathode diffusions 128 and P type contacts 118 formed in P type inversion region 116.

Bipolar semiconductor device 100A also includes control trench 120 extending from top surface 106 of semiconductor substrate 102, through P type inversion region 116, and into N type drift region 114. As further shown in FIG. 1A, control trench 120 has width 126, is bordered by N type cathode diffusions 128, and includes control trench insulator 122 and control trench electrode 124. In addition, bipolar semiconductor device 100A includes deep sub-trench structure 130 having width 132 and situated under control trench 120 to a depth 138 below top surface 106 of semiconductor substrate 102. As shown in FIG. 1A, deep sub-trench structure 130 includes one or more N type regions 134 and one or more P type regions 136. One or more N type regions 134 and one or more P type regions 136 are configured to substantially charge-balance deep sub-trench structure 130.

It is noted that, in operation, bipolar semiconductor device 100A is configured to produce a conduction channel through P type inversion region 116 in regions beneath N type cathode diffusions 128 and immediately adjacent control trench 120. Thus, when bipolar semiconductor device 100A is turned on, conduction channels (not shown as such in FIG. 1A) are produced as N type conduction channels through P type inversion region 116 so as to enable transfer of charge carriers between N type cathode diffusions 128 and P type anode layer 110.

It is further noted that although the implementation shown in FIG. 1A depicts bipolar semiconductor device 100A as having P type anode layer 110, N type buffer layer 112, N type drift region 114, P type inversion region 116, N type cathode diffusions 128, and as being configured to produce N type conduction channels, that representation is merely exemplary. In other implementations, the described polarities can be reversed. That is to say, bipolar semiconductor device 100A may have an N type layer corresponding to P type anode layer 110, a P type buffer layer, a P type drift region, an N type inversion region, P type diffusions corresponding to N type cathode diffusions 128, and may be configured to produce a P type conduction channel adjacent control trench 120.

According to one exemplary implementation, bipolar semiconductor device 100A may take the form of an insulated-gate bipolar transistor (IGBT). In that implementation, P type anode layer 110 corresponds to a P type collector layer, P type inversion region 116 corresponds to a P type base, and N type cathode diffusions 128 correspond to N type emitter diffusions of the IGBT. Moreover, when bipolar semiconductor device 100A is implemented as an IGBT, control trench 120 corresponds to a gate trench of the IGBT including a gate dielectric and a gate electrode corresponding respectively to control trench dielectric 122 and control trench electrode 124.

Semiconductor substrate 102 may be a silicon (Si) substrate or a silicon carbide (SIC) substrate, for example. In some implementations, semiconductor substrate 102 may include N type drift region 114 and P type inversion region 116 formed in an epitaxial silicon layer of semiconductor substrate 102. Formation of such an epitaxial silicon layer may be performed by any suitable method, as known in the art, such as chemical vapor deposition (CVD) or molecular beam epitaxy (MBE), for example. More generally, however, N type drift region 114 and P type inversion region 116 may be formed in any suitable elemental or compound semiconductor layer included in semiconductor substrate 102.

Thus, in other implementations, N type drift region 114 and P type inversion region 116 need not be formed through epitaxial growth, and/or need not be formed of silicon. For example, in one alternative implementation, N type drift region 114 and P type inversion region 116 can be formed in a float zone silicon layer of semiconductor substrate 102. In other implementations, N type drift region 114 and P type inversion region 116 can be formed in either a strained or unstrained germanium layer formed as part of semiconductor substrate 102. Moreover, in some implementations, semiconductor substrate 102 may include additional layers, such as N type buffer layer 112 situated between P type anode layer 110 and N type drift region 114, as shown in FIG. 1A.

P type inversion region 116 may be formed by implantation and thermal diffusion. For example, boron (B) dopants may be implanted into semiconductor substrate 102 and diffused to form P type inversion region 116. Moreover, P type contacts 118 of P type inversion region 116 may be more highly doped regions of P type inversion region 116 utilizing the same dopant species used to form P type inversion region 116.

Control trench insulator 122 may be formed using any material and any technique typically employed in the art. For example, control trench insulator 122 may be formed of silicon oxide, and may be deposited or thermally grown to line control trench 120. Control trench electrode 124 may also be formed using any material typically utilized in the art. For example, control trench electrode 124 may be formed of doped polysilicon or metal.

As shown in FIG. 1A, control trench 120 is bordered by N type cathode diffusions 128. N type cathode diffusions 128 may be selectively formed in P type inversion region 116 using any conventional techniques known in the art. For example, phosphorus (P) or arsenic (As) dopants may be implanted into P type inversion region 116 and diffused to form N type cathode diffusions 128. Although not explicitly shown in FIG. 1A, N type cathode diffusions 128 can be electrically connected to one another in the third dimension relative to the cross-sectional perspective shown by FIG. 1A.

As noted above, deep sub-trench structure 130 includes at least one N type region 134 and at least one P type region 136. Moreover, and as shown in FIG. 1A, in some implementations, deep sub-trench structure 130 may include multiple N type regions 134 and multiple P type regions 136. However, in no implementation does deep sub-trench structure 130 include more P type regions 136 than N type regions 134. In other words, while the number of N type regions 134 may equal or exceed the number of P type regions 136, the number of N type regions 134 is never less than the number of P type regions 136.

In one implementation, for example, deep sub-trench structure 130 may include one N type region 134 adjoined by one P type region 136. In another exemplary implementation, deep sub-trench structure 130 may include two N type regions 134 and one P type region 136 situated between and adjoining the two N type regions 134. In yet another exemplary implementation, deep sub-trench structure 130 may include multiple N type regions 134 and multiple P type regions 136, where each P type region 136 is situated between two N type regions 134.

N type regions 134 and P type regions 136 of deep sub-trench structure 130 may have a doping concentration greater than that of N type drift region 114 and less than that of N type cathode diffusions 128. In one implementation, N type regions 134 and P type regions 136 may have a doping concentration substantially equal to that of N type buffer layer 112. For example, N type regions 134 and P type regions 136 may have a doping concentration of from approximately $1\times10^{15}/cm^3$ to approximately $1\times10^{16}/cm^3$, while the doping concentration of N type drift region 114 is typically from approximately $1\times10^{13}/cm^3$ to approximately $2\times10^{14}/cm^3$.

According to the implementation shown in FIG. 1A, deep sub-trench structure 130 has width 132 less than or substantially equal to width 126 of control trench 120. Moreover, according to the present implementation, deep sub-trench structure 130 terminates in N type drift region 114 at depth 138, which is above N type buffer layer 112. In other words, in some implementations, deep sub-trench structure 130 is spaced apart from N type buffer layer 112 by N type drift region 114.

Referring to FIG. 1B, FIG. 1B presents a cross-sectional view showing a portion of exemplary bipolar semiconductor device 100B having a deep charge-balanced structure, according to another implementation. It is noted that features identified by reference numbers previously shown and described in relation to FIG. 1A, above, correspond respectively to those previously discussed features and may share any of the characteristics attributed to those features in the present application. Thus, like bipolar semiconductor device 100A, in FIG. 1A, bipolar semiconductor device 100B, in FIG. 1B, may take the form of an IGBT.

In contrast to the implementation shown by FIG. 1A, however, in which deep sub-trench structure 130 extends to depth 138 within N type drift region 114, according to the implementation in FIG. 1B, deep sub-trench structure 130 extends to N type buffer layer 112. That is to say, according to the implementation shown in FIG. 1B, deep sub-trench structure 130 extends through N type drift region 114 so as to adjoin N type buffer layer 112. As a result, in implementations in which deep sub-trench structure 130 adjoins N type buffer layer 112, and includes more N type regions 134 than P type regions 136, N type regions 134 are adjoined by N type drift region 114. Thus, in some implementations in which deep sub-trench structure 130 adjoins N type buffer layer 112, and includes more N type regions 134 than P type regions 136, no portion of deep sub-trench structure 130 forms a PN junction with N type drift region 114.

As noted above, N type region or regions 134 and P type region or regions 136 are configured to substantially charge-balance deep sub-trench structure 130. That substantial charge-balance of deep sub-trench structure 130 is achieved when the surface doping density of N type region(s) 134, which equals the doping density of N type region(s) 134 multiplied by the area of N type region(s) 134 (i.e., width× depth) is substantially equal to the surface doping density of P type region(s) 136, which is analogously calculated. During turn-off of bipolar semiconductor device 100A/100B, the depletion region extends rapidly from the top of N type drift region 114 to N type buffer layer 112 due to the two-dimensional fast depletion of N type region(s) 134 and P type region(s) 136, which also enables fast extraction of deep charge carriers.

As a result, the delay time and turn-off time of bipolar semiconductor device 100A/100B can be reduced, while the voltage blocking in the off-state is facilitated by the presence of deep sub-trench structure 130. During turn-off, charge-balanced deep sub-trench structure 130 assists in the removal of charge carriers from N type drift region 114, which is conductivity modulated, thereby significantly enhancing the switching speed and turn-off performance of bipolar semiconductor device 100A/100B. In other words, charge-balanced deep sub-trench structure 130 enables bipolar semiconductor device 100A/100B to have lower turn-off losses ($E_{OFF}$), shorter delay time ($T_d$), and shorter turn-off time ($T_f$), when compared to conventional bipolar semiconductor devices, such as conventional IGBTs. Moreover, the above advantages may be achieved while maintaining the on-state voltage drop ($V_{ON}$) of bipolar semiconductor device 100A/100B at a desirably low level.

Figure 2A:
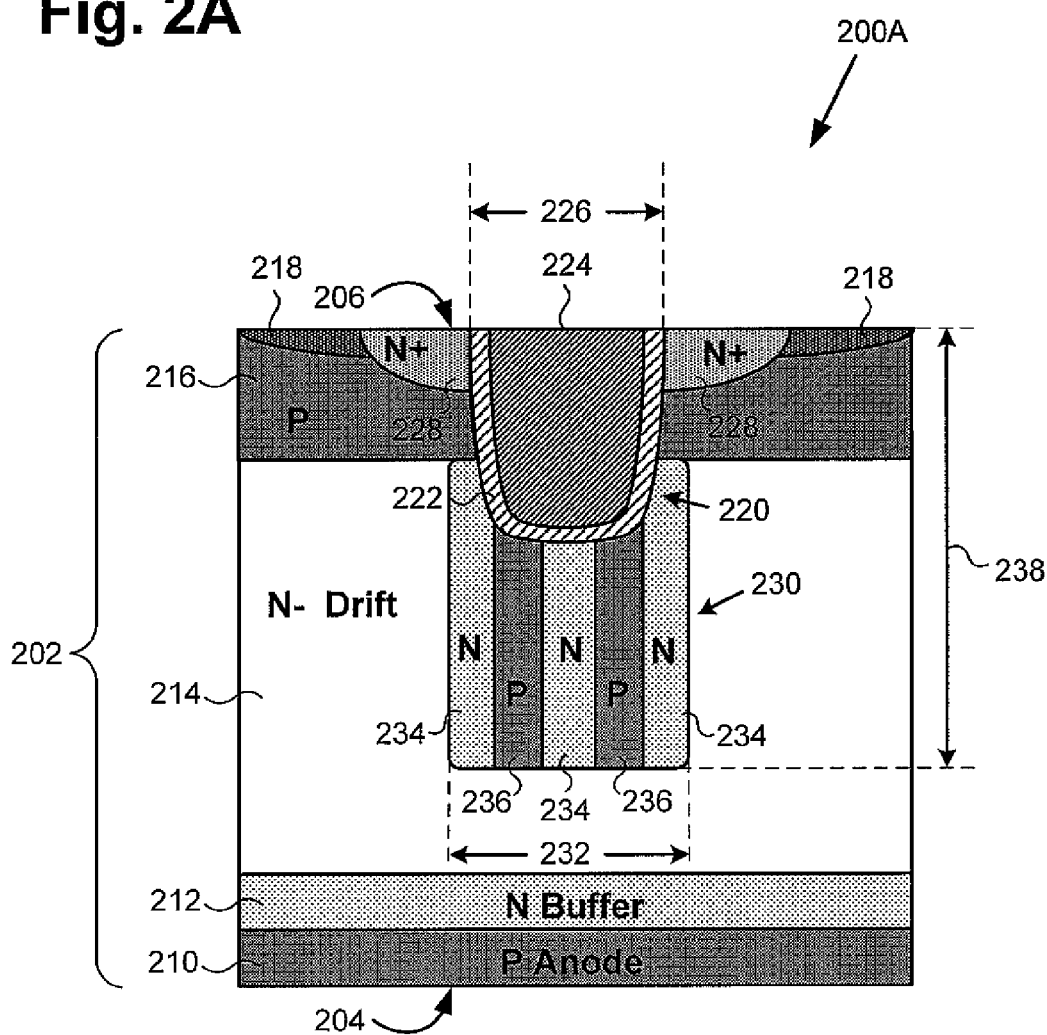
FIG. 2A presents a cross-sectional view showing a portion of an exemplary bipolar semiconductor device having a deep charge-balanced structure, according to still another implementation.

Continuing to FIG. 2A, FIG. 2A presents a cross-sectional view showing a portion of exemplary bipolar semiconductor device 200A having a deep charge-balanced structure, according to another implementation. As shown in FIG. 2A, bipolar semiconductor device 200A is implemented as a vertical power device including P type anode layer 210 at bottom surface 204 of semiconductor substrate 202, and N type drift region 214 situated over P type anode layer 210. In addition, P type inversion region 216 is situated over N type drift region 214. As further shown in FIG. 2A, bipolar semiconductor device 200A includes N type buffer layer 212, as well as N type cathode diffusions 228 and P type contacts 218 formed in P type inversion region 216.

Bipolar semiconductor device 200A also includes control trench 220 extending from top surface 206 of semiconductor substrate 202, through P type inversion region 216, and into N type drift region 214. As further shown in FIG. 2A, control trench 220 has width 226, is bordered by N type cathode diffusions 228, and includes control trench insulator 222 and control trench electrode 224. In addition, bipolar semiconductor device 200A includes deep sub-trench structure 230 having width 232 and situated under control trench 220 to a depth 238 below top surface 206 of semiconductor substrate 202. As shown in FIG. 2A, deep sub-trench structure 230 includes one or more N type regions 234 and one or more P type regions 236. One or more N type regions 234 and one or more P type regions 236 are configured to substantially charge-balance deep sub-trench structure 230.

Bipolar semiconductor device 200A corresponds in general to bipolar semiconductor device 100A, in FIG. 1A. That is to say, semiconductor substrate 202, P type anode layer 210, N type buffer layer 212, and N type drift region 214, in FIG. 2A, correspond respectively in general to semiconductor substrate 102, P type anode layer 110, N type buffer layer 112, and N type drift region 114, in FIG. 1A, and may share any of the characteristics attributed to those corresponding features, above.

In addition, P type inversion region 216, P type contacts 218, and N type cathode diffusions 228, in FIG. 2A, correspond respectively in general to P type inversion region 116, P type contacts 118, and N type cathode diffusions 128, in FIG. 1A and may share any of the characteristics attributed to those corresponding features, above. Moreover, depth 238, and control trench 220 having width 226 and including control trench insulator 222 and control trench electrode 224, in FIG. 2A, correspond respectively in general to depth 138, and control trench 120 having width 126 and including control trench insulator 122 and control trench electrode 124, in FIG. 1A, and may share any of the characteristics attributed to those corresponding features, above. Furthermore, it is noted that, like bipolar semiconductor device 100A, in FIG. 1A, bipolar semiconductor device 200A, in FIG. 2A, may take the form of an IGBT.

As shown in FIG. 2A, deep sub-trench structure 230 includes at least one N type region 234 and at least one P type region 236. Moreover, and as further shown in FIG. 2A, in some implementations, deep sub-trench structure 230 may include multiple N type regions 234 and multiple P type regions 236. However, in no implementation does deep sub-trench structure 230 include more P type regions 236 than N type regions 234. In other words, while the number of N type regions 234 may equal or exceed the number of P type regions 236, the number of N type regions 234 is never less than the number of P type regions 236.

In one implementation, for example, deep sub-trench structure 230 may include one N type region 234 adjoined by one P type region 236. In another exemplary implementation, deep sub-trench structure 130 may include two N type regions 234 and one P type region 236 situated between and adjoining the two N type regions 234. In yet another exemplary implementation, deep sub-trench structure 230 may include multiple N type regions 234 and multiple P type regions 236, where each P type region 236 is situated between two N type regions 234.

N type regions 234 and P type regions 236 of deep sub-trench structure 230 may have a doping concentration greater than that of N type drift region 214 and less than that of N type cathode diffusions 228. In one implementation, N type regions 234 and P type regions 236 may have a doping concentration substantially equal to that of N type buffer layer 212. For example, N type regions 234 and P type regions 236 may have a doping concentration of from approximately $1\times10^{15}/cm^3$ to approximately $1\times10^{16}/cm^3$.

According to the implementation shown in FIG. 2A, deep sub-trench structure 230 has width 232 greater than width 226 of control trench 220. Moreover, according to the present implementation, deep sub-trench structure 230 terminates in N type drift region 214 at depth 238, which is above N type buffer layer 212. In other words, in some implementations, deep sub-trench structure 230 is spaced apart from N type buffer layer 212 by N type drift region 214. In addition, and as further shown in FIG. 2A, in some implementations, deep sub-trench structure 230 surrounds a portion of control trench 220 so as to adjoin P type inversion region 216.

Figure 2B:
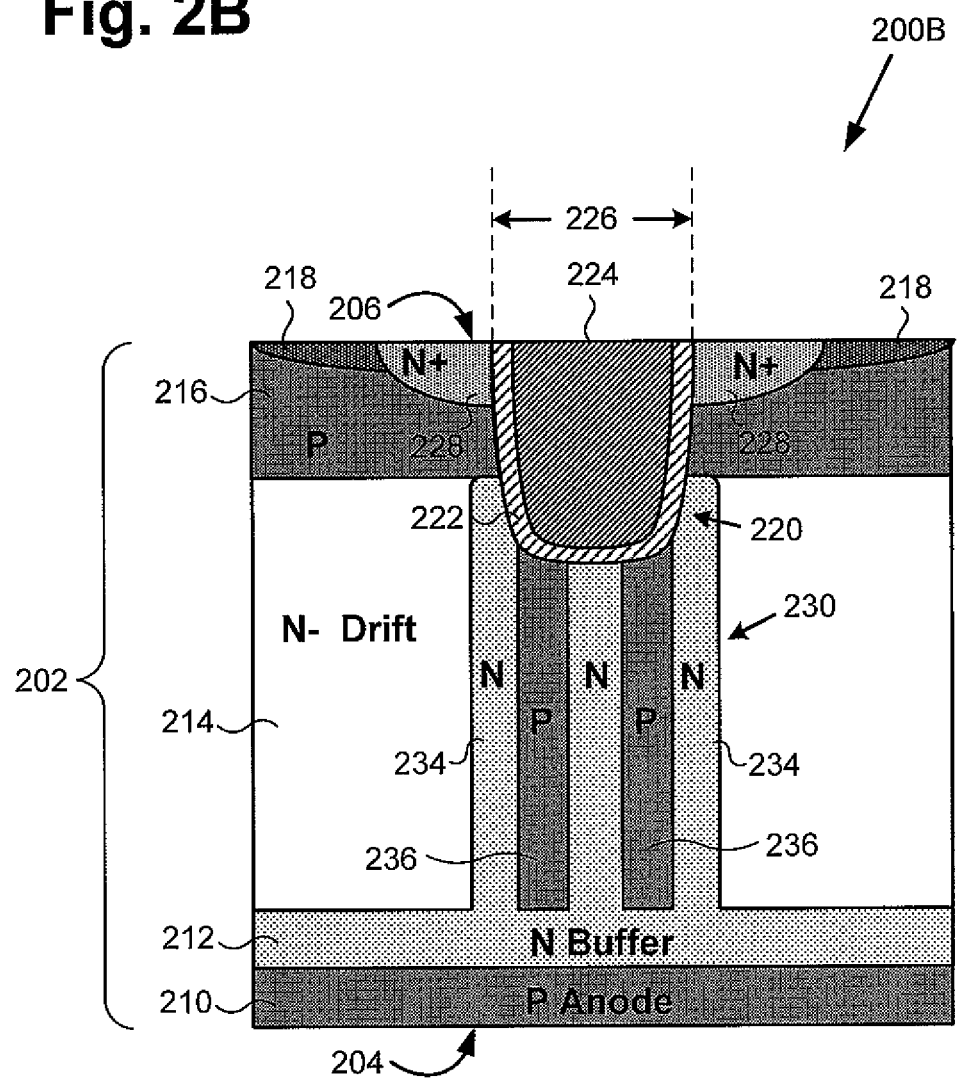
FIG. 2B presents a cross-sectional view showing a portion of an exemplary bipolar semiconductor device having a deep charge-balanced structure, according to yet another implementation.

Referring to FIG. 2B, FIG. 2B presents a cross-sectional view showing a portion of exemplary bipolar semiconductor device 200B having a deep charge-balanced structure, according to yet another implementation. It is noted that features identified by reference numbers previously shown and described in relation to FIG. 2A, above, correspond respectively to those previously discussed features and may share any of the characteristics attributed to those features in the present application. Thus, like bipolar semiconductor device 200A, in FIG. 2A, bipolar semiconductor device 200B, in FIG. 2B, may take the form of an IGBT.

In contrast to the implementation shown by FIG. 2A, however, in which deep sub-trench structure 230 extends to depth 238 within N type drift region 214, according to the implementation in FIG. 2B, deep sub-trench structure 230 extends to N type buffer layer 212. That is to say, according to the implementation shown in FIG. 2B, deep sub-trench structure 230 extends through N type drift region 214 so as to adjoin N type buffer layer 212, while also adjoining P type inversion region 216. As a result, in implementations in which deep sub-trench structure 230 adjoins P type inversion region 216 and N type buffer layer 212, and includes more N type regions 234 than P type regions 236, N type regions 234 are adjoined by N type drift region 214. Thus, in some implementations in which deep sub-trench structure 230 adjoins P type inversion region 216 and N type buffer layer 212, and includes more N type regions 234 than P type regions 236, no portion of deep sub-trench structure 230 forms a PN junction with N type drift region 214.

N type region or regions 234 and P type region or regions 236 are configured to substantially charge-balance deep sub-trench structure 230. That substantial charge-balance of deep sub-trench structure 230 is achieved when the surface doping density of N type region(s) 234, which equals the doping density of N type region(s) 234 multiplied by the area of N type region(s) 234 (i.e., width×depth) is substantially equal to the surface doping density of P type region(s) 236, which is analogously calculated. During turn-off of bipolar semiconductor device 200A/200B, the depletion region extends rapidly from the top of N type drift region 214 to N type buffer layer 212 due to the two-dimensional fast depletion of N type region(s) 234 and P type region(s) 236, which also enables fast extraction of deep charge carriers.

As a result, the delay time and turn-off time of bipolar semiconductor device 200A/200B can be reduced, while the voltage blocking in the off-state is facilitated by the presence of deep sub-trench structure 230. During turn-off, charge-balanced deep sub-trench structure 230 assists in the removal of charge carriers from N type drift region 214, which is conductivity modulated, thereby significantly enhancing the switching speed and turn-off performance of bipolar semiconductor device 200A/200B. In other words, charge-balanced deep sub-trench structure 230 enables bipolar semiconductor device 200A/200B to have lower $E_{OFF}$, shorter $T_d$, and shorter $T_f$, when compared to conventional bipolar semiconductor devices, such as conventional IGBTs. Moreover, the above advantages may be achieved while maintaining the $V_{ON}$ of bipolar semiconductor device 200A/200B at a desirably low level.

Figure 3A:
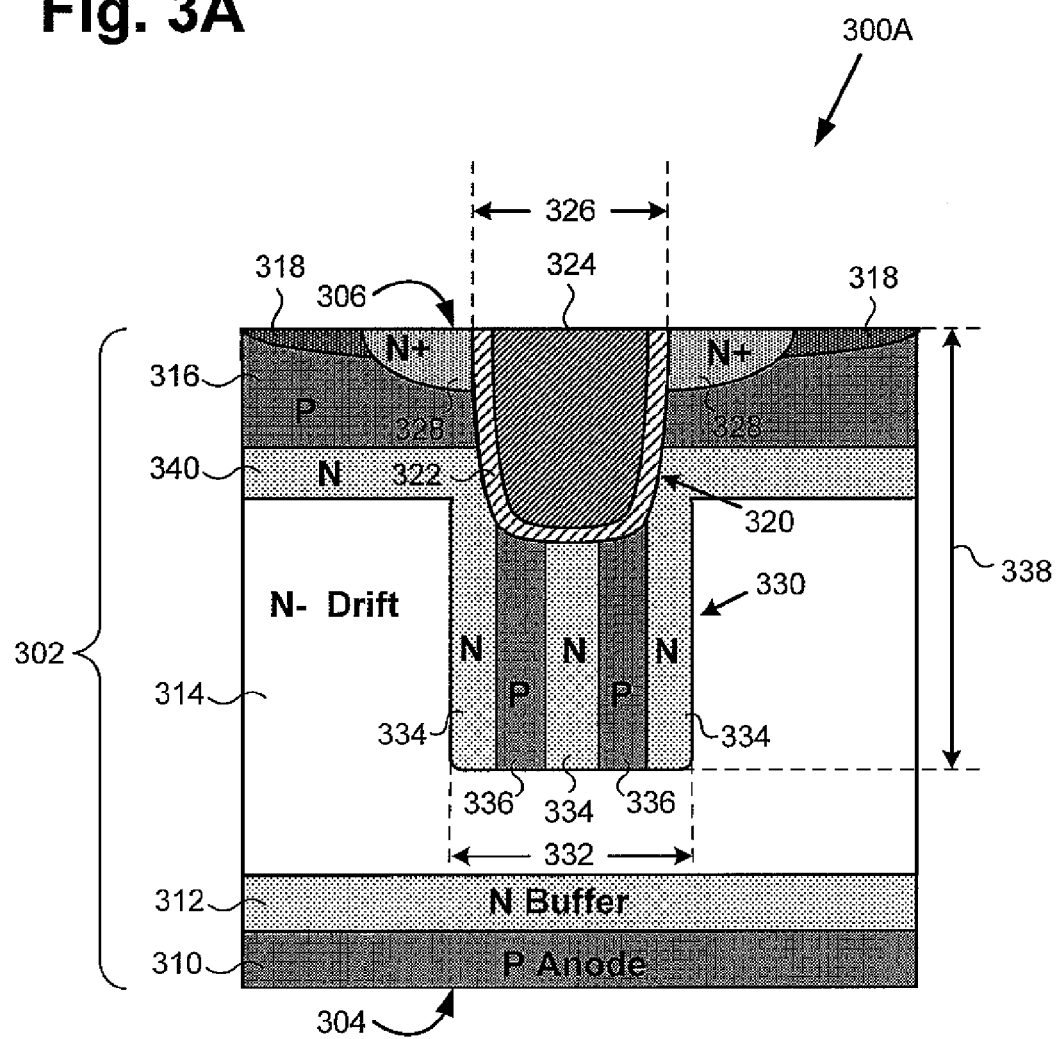
FIG. 3A presents a cross-sectional view showing a portion of an exemplary bipolar semiconductor device having a deep charge-balanced structure, according to a further implementation.

Moving to FIG. 3A, FIG. 3A presents a cross-sectional view showing a portion of exemplary bipolar semiconductor device 300A having a deep charge-balanced structure, according to still another implementation. As shown in FIG. 3A, bipolar semiconductor device 300A is implemented as a vertical power device including P type anode layer 310 at bottom surface 304 of semiconductor substrate 302, and N type drift region 314 situated over P type anode layer 310. In addition, P type inversion region 316 is situated over N type drift region 314. As further shown in FIG. 3A, bipolar semiconductor device 300A includes N type buffer layer 312, as well as N type cathode diffusions 328 and P type contacts 318 formed in P type inversion region 316. Moreover, bipolar semiconductor device 300A further includes N type enhancement layer 340 situated between N type drift region 314 and P type inversion region 316.

Bipolar semiconductor device 300A also includes control trench 320 extending from top surface 306 of semiconductor substrate 302, through P type inversion region 316, through N type enhancement layer 340, and into N type drift region 314. As further shown in FIG. 3A, control trench 320 has width 326, is bordered by N type cathode diffusions 328, and includes control trench insulator 322 and control trench electrode 324. In addition, bipolar semiconductor device 300A includes deep sub-trench structure 330 having width 332 and situated under control trench 320 to a depth 338 below top surface 306 of semiconductor substrate 302. As shown in FIG. 3A, deep sub-trench structure 330 includes one or more N type regions 334 and one or more P type regions 336. One or more N type regions 334 and one or more P type regions 336 are configured to substantially charge-balance deep sub-trench structure 330.

Semiconductor substrate 302, P type anode layer 310, N type buffer layer 312, and N type drift region 314, in FIG. 3A, correspond respectively in general to semiconductor substrate 102, P type anode layer 110, N type buffer layer 112, and N type drift region 114, in FIG. 1A, and may share any of the characteristics attributed to those corresponding features, above. In addition, P type inversion region 316, P type contacts 318, and N type cathode diffusions 328, in FIG. 3A, correspond respectively in general to P type inversion region 116, P type contacts 118, and N type cathode diffusions 128, in FIG. 1A and may share any of the characteristics attributed to those corresponding features, above.

Depth 338, and control trench 320 having width 326 and including control trench insulator 322 and control trench electrode 324, in FIG. 3A, correspond respectively in general to depth 138, and control trench 120 having width 126 and including control trench insulator 122 and control trench electrode 124, in FIG. 1A, and may share any of the characteristics attributed to those corresponding features, above. Moreover, deep sub-trench structure 330 having width 332 greater than width 326 of control trench 320, and including one or more N type regions 334 and one or more P type regions 336 corresponds in general to deep sub-trench structure 230 having width 232 greater than width 226 of control trench 220, and including one or more N type regions 234 and one or more P type regions 236, in FIG. 2A, and may share any of the characteristics attributed to those corresponding features, above. Furthermore, it is noted that in some implementations, bipolar semiconductor device 300A may take the form of an IGBT.

According to the implementation shown in FIG. 3A, N type enhancement layer 340 is situated between N type drift region 314 and P type inversion region 316. For example, phosphorus or arsenic dopants may be implanted into N type drift region 314 to produce N type enhancement layer 340 having a doping concentration of from approximately $1 \times 10^{15}/cm^3$ to approximately $1 \times 10^{16}/cm^3$. In addition, and as further shown in FIG. 3A, in some implementations, deep sub-trench structure 330 surrounds a portion of control trench 320 so as to adjoin N type enhancement layer 340. Moreover, according to the present implementation, deep sub-trench structure 330 terminates in N type drift region 314 at depth 338, which is above N type buffer layer 312. In other words, in some implementations, deep sub-trench structure 330 adjoins N type enhancement layer 340 while being spaced apart from N type buffer layer 312 by N type drift region 314.

Figure 3B:
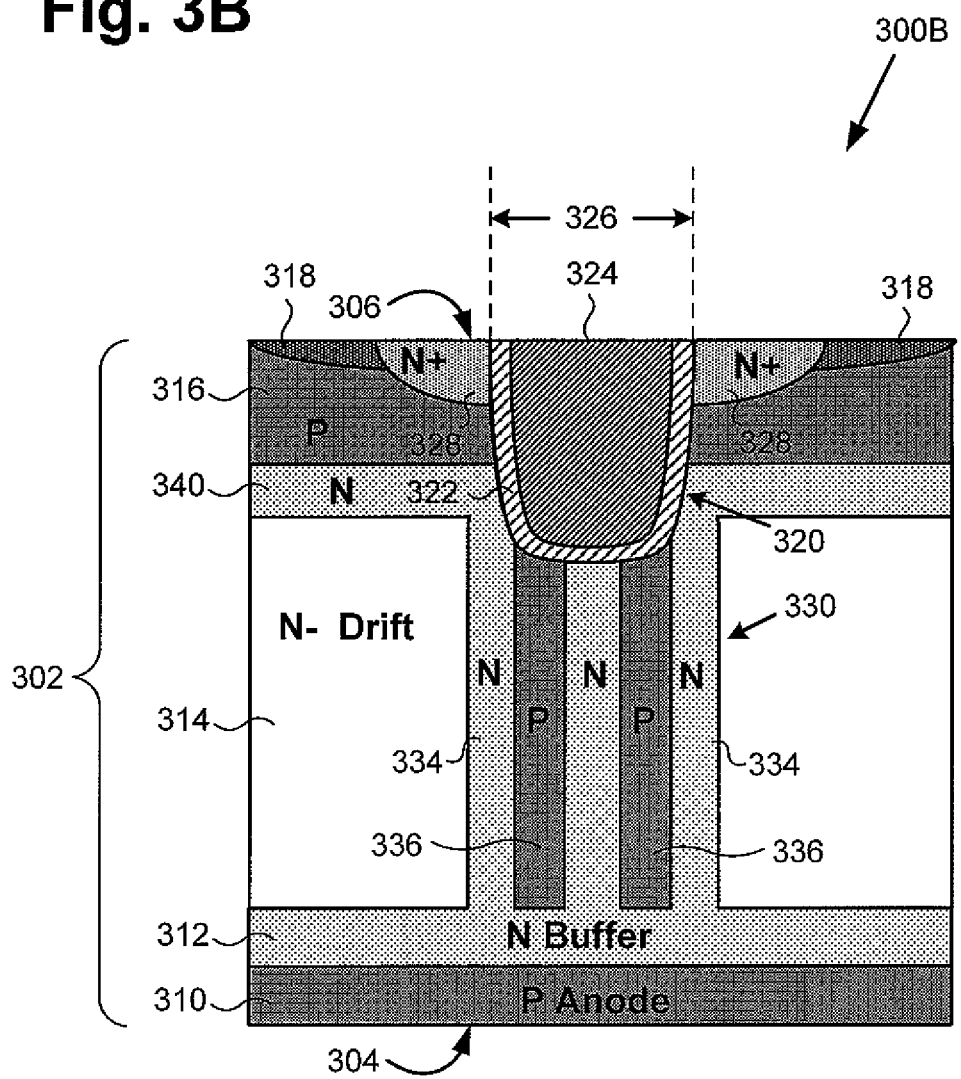
FIG. 3B presents a cross-sectional view showing a portion of an exemplary bipolar semiconductor device having a deep charge-balanced structure, according to another implementation.

Referring to FIG. 3B, FIG. 3B presents a cross-sectional view showing a portion of exemplary bipolar semiconductor device 300B having a deep charge-balanced structure, according to another implementation. It is noted that features identified by reference numbers previously shown and described in relation to FIG. 3A, above, correspond respectively to those previously discussed features and may share any of the characteristics attributed to those features in the present application. Thus, like bipolar semiconductor device 300A, in FIG. 3A, bipolar semiconductor device 300B, in FIG. 3B, may take the form of an IGBT.

In contrast to the implementation shown by FIG. 3A, however, in which deep sub-trench structure 330 extends to depth 338 within N type drift region 314, according to the implementation in FIG. 3B, deep sub-trench structure 330 extends to N type buffer layer 312. That is to say, according to the implementation shown in FIG. 3B, deep sub-trench structure 330 extends through N type drift region 314 so as to adjoin N type buffer layer 312, while also adjoining N type enhancement layer 340. As a result, in implementations in which deep sub-trench structure 330 adjoins N type enhancement layer 340 and N type buffer layer 312, and includes more N type regions 334 than P type regions 336, N type regions 334 are adjoined by N type drift region 314. Thus, in some implementations in which deep sub-trench structure 330 adjoins N type enhancement layer 340 and N type buffer layer 312, and includes more N type regions 334 than P type regions 336, no portion of deep sub-trench structure 330 forms a PN junction with N type drift region 314.

N type region or regions 334 and P type region or regions 336 are configured to substantially charge-balance deep sub-trench structure 330, as discussed above by reference to deep sub-trench structures 130 and 230. As a result, during turn-off of bipolar semiconductor device 300A/300B, the depletion region extends rapidly from the top of N type drift region 314 to N type buffer layer 312 due to the two-dimensional fast depletion of N type region(s) 334 and P type region(s) 336, which also enables fast extraction of deep charge carriers. Consequently, the delay time and turn-off time of bipolar semiconductor device 300A/300B can be reduced, while the voltage blocking in the off-state is facilitated by the presence of deep sub-trench structure 330. During turn-off, charge-balanced deep sub-trench structure 330 assists in the removal of charge carriers from N type drift region 314, which is conductivity modulated, thereby significantly enhancing the switching speed and turn-off performance of bipolar semiconductor device 300A/300B.

Thus, the present application discloses implementations of a bipolar semiconductor device having a deep charge-balanced structure. As disclosed in the present application, incorporating such a deep charge-balanced structure into the bipolar semiconductor device enables the bipolar semiconductor device to have lower $E_{OFF}$, shorter $T_d$, and shorter $T_f$, when compared to conventional devices, such as conventional IGBTs. Moreover, these advantages may be achieved while maintaining the $V_{ON}$ of the bipolar semiconductor device at a desirably low level.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. An insulated-gate bipolar transistor (IGBT) comprising:
a drift region having a first conductivity type situated over a collector having a second conductivity type opposite said first conductivity type;
a gate trench extending through a base having said second conductivity type into said drift region, said gate trench bordered by an emitter diffusion having said first conductivity type;
a deep sub-trench structure comprising at least one first conductivity region having said first conductivity type situated in said drift region directly under said gate trench and at least one second conductivity region having said second conductivity type situated in said drift region directly under said gate trench;
said at least one first conductivity region and said at least one second conductivity region configured to substantially charge-balance said deep sub-trench structure.

2. The IGBT of claim 1, wherein said deep sub-trench structure comprises two said first conductivity regions and one said second conductivity region, said second conductivity region situated between said two first conductivity regions.

3. The IGBT of claim 1, wherein said deep sub-trench structure comprises a first plurality of said first conductivity regions and a second plurality of said second conductivity regions, said first plurality being greater than said second plurality.

4. The IGBT of claim 1, wherein said deep sub-trench structure comprises a first plurality of said first conductivity regions and a second plurality of said second conductivity regions, and wherein each of said second conductivity regions is situated between two of said first conductivity regions.

5. The IGBT of claim 1, wherein said deep sub-trench structure has a width that is less than or substantially equal to a width of said gate trench.

6. The IGBT of claim 1, wherein said deep sub-trench structure has a width that is greater than a width of said gate trench.

7. The IGBT of claim 1, wherein said deep sub-trench structure adjoins said base.

8. The IGBT of claim 1, further comprising an enhancement layer having said first conductivity type situated between said drift region and said base, wherein said deep sub-trench structure adjoins said enhancement layer.

9. The IGBT of claim 1, further comprising a buffer layer having said first conductivity type situated between said collector and said drift region, said deep sub-trench structure being spaced apart from said buffer layer by said drift region.

10. The IGBT of claim 1, further comprising a buffer layer having said first conductivity type situated between said collector and said drift region, said deep sub-trench structure adjoining said buffer layer.

* * * * *

UNITED STATES PATENT AND TRADEMARK OFFICE
CERTIFICATE OF CORRECTION

| | |
|---|---|
| PATENT NO. | : 9,831,330 B2 |
| APPLICATION NO. | : 14/986054 |
| DATED | : November 28, 2017 |
| INVENTOR(S) | : F. Udrea et al. |

Page 1 of 1

It is certified that error appears in the above-identified patent and that said Letters Patent is hereby corrected as shown below:

On the Title Page

Abstract (Line 13), please change "region" to -- regions --

Signed and Sealed this
Thirtieth Day of January, 2018

Joseph Matal
*Performing the Functions and Duties of the*
*Under Secretary of Commerce for Intellectual Property and*
*Director of the United States Patent and Trademark Office*